(12) United States Patent
Bronson (10) Patent No.: US 11,921,544 B1
(45) Date of Patent: Mar. 5, 2024

(54) GROUND ACCESSIBLE IOT BASE AND BLOCK WITH ENCLOSURES

(71) Applicant: Glenn Joseph Bronson, Chelmsford, MA (US)

(72) Inventor: Glenn Joseph Bronson, Chelmsford, MA (US)

(*) Notice: Subject to any disclaimer, the term of this patent is extended or adjusted under 35 U.S.C. 154(b) by 0 days.

(21) Appl. No.: 17/558,293

(22) Filed: Dec. 21, 2021

Related U.S. Application Data (60) Provisional application No. 63/238,328, filed on Aug. 30, 2021.

(51) Int. Cl.
*G06F 1/16* (2006.01)
*H05K 7/14* (2006.01)

(52) U.S. Cl.
CPC ......... *G06F 1/1633* (2013.01); *H05K 7/1427* (2013.01)

(58) Field of Classification Search
CPC .. G06F 1/1633; H05K 7/1427; H02G 3/0493; F21S 8/085
See application file for complete search history.

(56) References Cited

U.S. PATENT DOCUMENTS

| | | | |
|---|---|---|---|
| 10,643,271 B1 | 5/2020 | Bronson | |
| 10,851,936 B1 | 12/2020 | Bronson | |
| 11,209,120 B1 | 12/2021 | Bronson | |
| 11,355,904 B1 * | 6/2022 | Bronson | .................. H02G 7/20 |
| 11,655,649 B2 * | 5/2023 | Mesch | ................. H05K 5/0204 |
| | | | 174/45 R |
| 2008/0100707 A1 * | 5/2008 | Brown | .................... H04N 7/185 |
| | | | 348/E7.086 |
| 2012/0020060 A1 * | 1/2012 | Myer | ...................... F21V 29/71 |
| | | | 362/183 |

FOREIGN PATENT DOCUMENTS

CN 107958595 A * 4/2018 ............... G08G 1/04

* cited by examiner

*Primary Examiner* — James Wu
(74) *Attorney, Agent, or Firm* — University of San Francisco School of Law; Sophia C. Iams (57) ABSTRACT

A ground accessible internet of things (IOT) base, cabinet and block with enclosures can rigidly support IOT devices mounted on vertical poles. The block can weight 2,000 pounds or more and can be placed on a ground surface and provide a rigid support for elongated poles. The block does not require digging or excavation of the ground. IOT electrical components that can be placed in protective enclosures within the block or attached to the elongated pole. The cabinet and base supports solar pane allowing tilting poles and enclosures to be mounted between them.

18 Claims, 10 Drawing Sheets

GROUND ACCESSIBLE IOT BASE AND BLOCK WITH ENCLOSURES

CROSS REFERENCE TO RELATED APPLICATIONS

This patent application claims priority to U.S. Provisional Patent Application No. 63/238,328, "Ground Accessible IOT Base And Block With Enclosures" filed Aug. 30, 2021, which is hereby incorporated by reference in its entirety.

BACKGROUND

Affordable and readily available radio communication and electronics equipment have spawned the deployment and installation of cameras, antennas, and other IOT (internet of things) devices. This equipment typically requires pole installation in strategic locations which many times are not readily located to facilitate either the digging of holes for the poles, or servicing them once they have been installed. This may be due to preexisting ground conditions, surrounding infrastructure or property lines that are in the way, zoning and setback requirements, or weather conditions such as large quantities of ice and snow.

In addition, typical pole installations have their IOT equipment, batteries and other critical components on the outside of the pole to facilitate servicing: this is typically done with external enclosures or service buildings. Unfortunately, this is not only more expensive and unsightly, in many cases, but also creates opportunity for vandalism, rodents, and other types of failures.
Problem Solved.

Poles that are placed need to have excavation for a hole which is not always feasible due to rocks, ledge water or other ground conditions, or existing buried infrastructure which is in the way such as road drainage, sewer, water and gas pipes. In addition, many states and companies do not want employees climbing ladders and lifts are required by companies or insurance underwriters to a void climbing. These restrictions add tremendously to the cost of servicing the pole. What is needed is a system that can support IOT devices mounted on stable poles that does not require digging or excavation of the ground.

DETAILED DESCRIPTION

Figure 1:
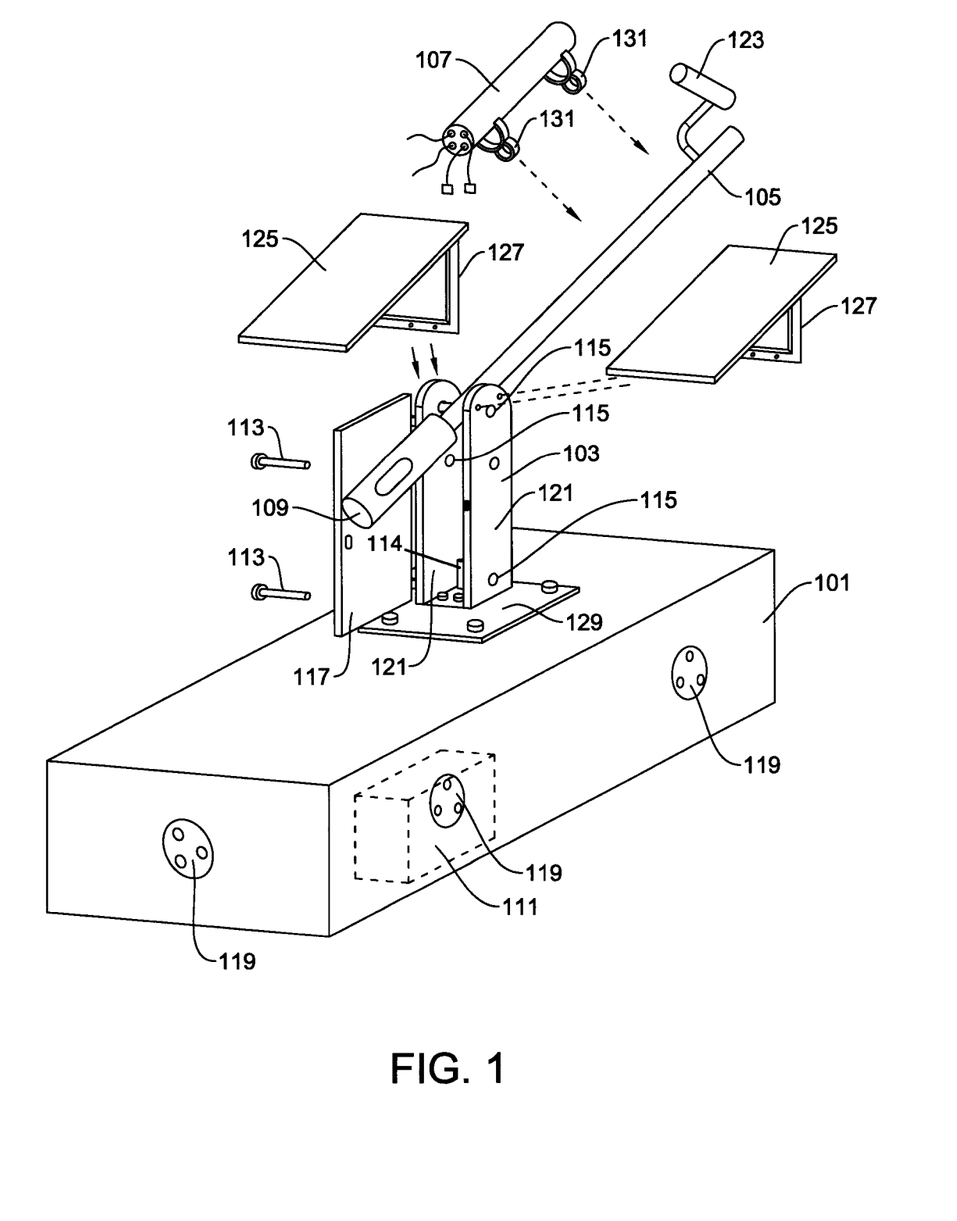
FIG. 1 is a top perspective exploded view of an embodiment of a ground accessible internet of things (IOT) apparatus.

FIG. 1 illustrates a top perspective exploded view of an embodiment of an internet of things apparatus. In the illustrated embodiment, the apparatus includes a block 101, a cabinet 103, an elongated pole 105, a sliding enclosure 107, a cabinet enclosure 109, block enclosure 111, and an IOT sensor 123 mounted to the elongated pole 105.

Figure 12:
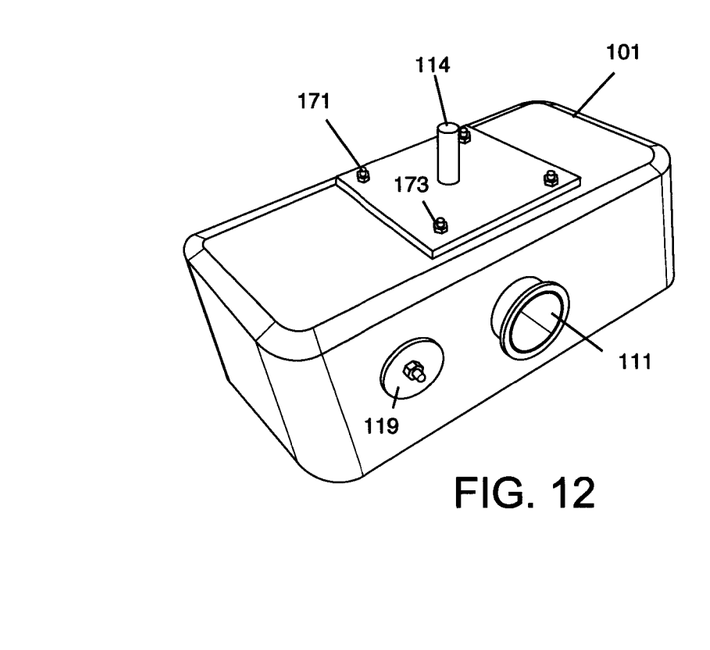
FIG. 12 is a top perspective view of an embodiment of a block.

In the embodiments illustrated in FIGS. 1 and 12, the block 101 is a large three-dimensional rectangular structure having a length, a width and a height. While the block 101 is illustrated as a three-dimensional rectangular structure in other embodiments, the block 101 can be any other three-dimensional geometric shape that can support the cabinet 103, elongated pole 105 and IOT apparatus 123 mount on the elongated pole 105. The shape of the block 101 can be a three-dimensional structure such as: a cylinder, 3D square, etc. In order to support the cabinet enclosure 109, elongated pole 105, and IOT sensor 123, the block 101 must be of sufficient weight to prevent the elongated pole 105 and IOT sensor 123 from falling over in all environmental conditions including very strong winds, earthquakes, etc. The block 101 should also provide some protection against collisions with moving objects such as vehicles. In some embodiments, the block 101 may weigh more than 1,200 lbs. The weight of the block 101 may also be proportional to the weight and height of the elongated pole 105 and the IOT sensor 123. In different embodiments, the block 101 can weigh between 1,000 and 2,500 pounds.

The block 101 can include a hollow block enclosure 111 and a block enclosure cover 119. The block enclosure 111 can be a waterproof hollow structure that creates an internal volume within the block 101. Components such as batteries, printed circuit boards, wiring, transceiver, and other electrical components can be securely housed within the block enclosure 111. The block enclosure 111 can include an access port or opening. (See FIG. 12) The block enclosure cover 119 can be mounted over the access port or opening. The block enclosure cover 119 can be secured to an outer surface of the block 101 and held in place with fasteners such as bolts which can be threaded into the block 101. In other embodiments, the block enclosure cover 119 can be secured with a locking mechanism to prevent unauthorized access to the block enclosure 111. In this illustrative example access to one or more of the enclosures 111 are on the side of a rectangular block 101, in various embodiments access to the enclosures 111 may be on the ends or top of the block 101 or in other locations.

The block 101 can also include a tubular conduit 114 that can extend from the upper surface of the block 101 to the block enclosure 111. Cables and/or wiring can run through the tubular conduit 114 so that electrical components in the block enclosure 111 can be electrically coupled to other electrical components in the cabinet 103, elongated pole 105, cabinet enclosure 109 and sliding enclosure 107. The tubular conduit 114 can extend above the upper surface of the block 101 so that liquids such as rain water are less likely to flow into the conduit 114 into the block enclosure 111. The conduit 114 can be a flexible plastic, metal, or any other suitable material.

The block 101 can be placed on top of a flat ground surface in such a way that none of the block 101 is below the top ground surface. This can be beneficial since the ground does not need to be dug up or excavated in order to provide support for the cabinet 103 and elongated pole 105. Excavation can be problematic when there are various underground utilities such as gas lines, water lines, sewer lines, communications cables, and electrical cables. Contacting or breaking any of these utility structures can result in damage to the community infrastructure and possibly injury if the live high voltage electrical wires are contacted or flammable gases are released. In other embodiments the block may be partially or fully buried.

In an embodiment, the block 101 can have a conduit 114 structure extending from block enclosure 111 through the upper surface of the block 101. The conduit can be a tube, channel or trough for protecting the writing. The conduit 114 can be a cylindrical structure that extends upward from the upper surface of the block 101 into the cabinet 105. The upper end of the conduit 114 can have a seal mechanism around the wires at the top of the conduit 114. In other embodiments, the conduit 114 can possibly be in an inverted U shape with the open end facing downward to prevent water from flowing into conduit 114. The conduit 114 can be: metal, plastic, or other suitable material.

Another benefit to the present invention can be costs and permitting requirements. It can be very expensive to obtain and operate heavy excavation equipment necessary to perform the required excavation and permitting may require multiple utility personnel to inspect the site and approve any excavation. In contrast, simply placing the block 101 on a desired location for an IOT device will not require any excavation and may also not need site inspection or approval for placing the block 101 at a desired location.

The cabinet 103 can be a hollow structure that has sidewalls 121 and a cabinet door 117. The cabinet 103 is rigidly mounted to the top surface of the block 101. In an embodiment, the cabinet 103 can include a flange 129 that has a planar lower surface and provides a mounting mechanism for securing the cabinet 103 to the block 101. In the illustrated example, the flange 129 can include bolt holes 163 through which nuts 173 and bolts 171 can be used to secure the flange 129 and cabinet 103 to the block 101.

The cabinet 103 can include a rotational coupling mechanism to the elongated pole 105. In the illustrated embodiment, the rotational coupling mechanism includes a plurality of pins 113 and holes 115. The upper portion of the cabinet 103 can include aligned holes 115 that extend through two parallel and opposite side walls 121 of the cabinet 103 and a lower portion of the elongated pole 105 can also have a rotational hole. A pin 113 can be placed through the holes 115 in the cabinet 103 as well as the hole in the elongated pole 105 and the pin 113 can be secured to the cabinet 103 to prevent the pin 113 from accidentally being removed. The pin 113 can create an axis of rotation for the elongated pole 105 so that the elongated pole 105 can rotate between a horizontal position and a more vertical position. The vertical position can be the position necessary for normal operation of the IOT sensor 123 mounted on the elongated pole 105 and the horizontal position allows repair and/or maintenance to be performed on the IOT sensor 123 on the ground. Because the elongated pole 105 can be rotated into a horizontal position, a worker will not need to climb the elongated pole 105 to perform work on the IOT sensor 123.

The upper surface of the block 101 preferably has a planar portion that can be substantially parallel with the ground upon which the block 101 rests. The cabinet 103 can be mounted on the upper planar surface of the block 101 and the elongated pole 105 may extend perpendicularly from the upper planar surface of the block 101.

Cabinet

With reference to FIGS. 1-4, the cabinet 103 can be an elongated box structure in a vertical orientation. The cabinet provide a support mechanism for the elongated pole 105 and include a hinge mechanism that allows the pole to rotate between an upright vertical position and a lowered horizontal position. The IOT device 123 may be placed at the top of the elongated pole 105 and may normally operate when the elongated pole 105 is in the upright vertical position. Maintenance and servicing can be performed on the IOT device 123 when the elongated pole 105 is in the lowered position. This rotational functionality can be beneficial because a repair person does not need to climb or be raised to the top of the pole to perform EIO device 123 maintenance.

The cabinet 103 also provides a protection mechanism for the cabinet enclosure 109. The cabinet enclosure 109 may include fragile IOT related electrical components which can be easily damaged. By housing the cabinet enclosure 109 within the cabinet 103, the components can be protected from the elements and vandalism. Solar Panels 125 can be mounted to brackets 127 that are attached to the cabinet 103. The solar panels 125 can be mounted on brackets 127 set to any angle and orientation depending on the location the IOT elongated pole 105.

Figure 2:
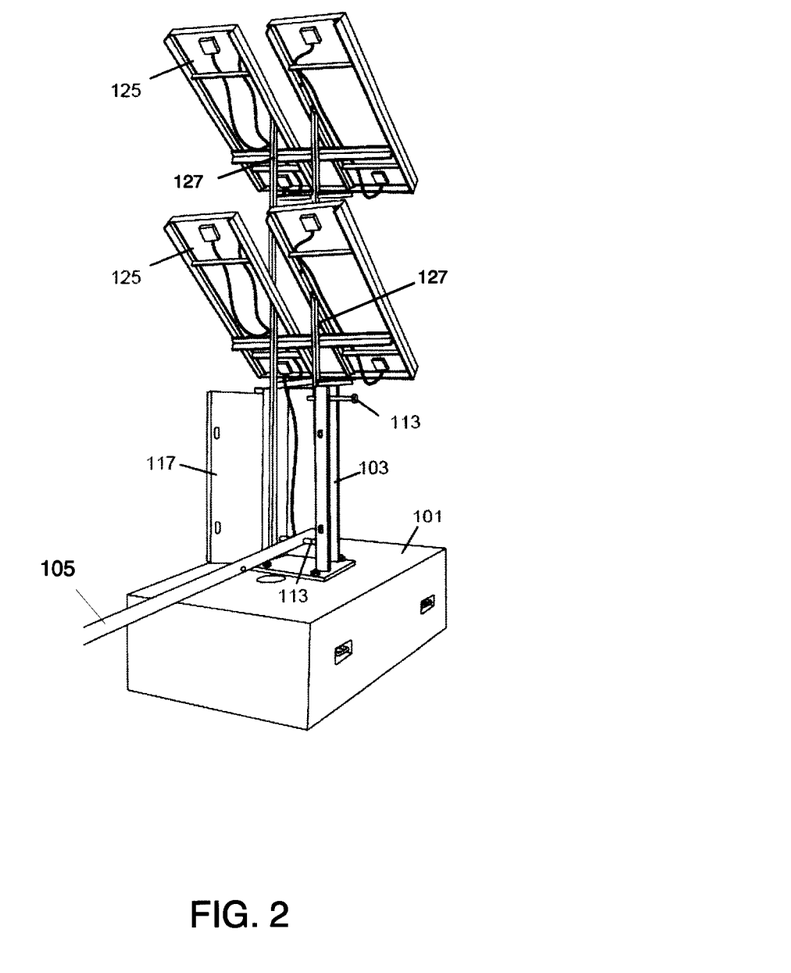
FIG. 2 is a rear view of an embodiment of a ground accessible internet of things (IOT) apparatus with a cabinet supporting stacked solar panels.

FIG. 2 illustrates a rear view of an embodiment of an internet of things apparatus that has four solar panels 125 that are in a stacked vertical configuration supported by brackets 127 that are coupled to the cabinet 103. The cabinet 103, brackets 127, and solar panels 125 are supported by the base bock 101. The configuration of the brackets 127 and solar panels 125 on opposite sides of the cabinet 103 allow the elongated pole 105 to tilt or remain untouched and stationary without any movement or interference with the brackets 127 and solar panels 125.

The cabinet 103 can include side walls 121. In an embodiment, the side walls 121 can be made of a thin strong material with sufficient strength for supporting the elongated pole 105. The planar sidewalls 121 can extend along the entire length of the cabinet 103. In the illustrated embodiment, the side walls 121 can form 3 of the 4 sides of the cabinet 103. The fourth wall of the cabinet 103 can be a hinged access door 117 that can be a flat planar structure that extends the length of the cabinet 103. A vertical edge of the hinged door 117 is attached to one of the sidewalls 121 with a plurality of hinges. The hinged door 117 can also have a lock mechanism that can secure the door 117 in the closed position when the lock mechanism is locked and allow access to the cabinet 103 when the lock is unlocked. Suitable materials include steel, metals, composite materials, etc.

The cabinet 103 can also include a rotational coupling between the cabinet 103 and the elongated pole 105. In an embodiment, the rotational coupling can include a plurality of holes 145 and pins or rods 113. Holes 115 can be formed in at least two of the side walls 121 so that a first pin 113 or rod can be placed through a first pair of holes 115 with the first pin 113 or rod being in a horizontal orientation. The first pin 113 or rod will also extend through an upper hole in the proximal portion of the pole. The pole 105 can rotate about the pin 113 or rod when the pole 105 is moved between an upright position and a more horizontal position. The pole 105 may also have a second hole that functions as a stabilization mechanism. In the upright position, the second pin 141 or rod can be placed through a lower in the pole and through lower holes 145 in the sidewalls 121 of the cabinet 103.

In other embodiment, the rotational coupling can be a mechanical hinge that does not require holes in the cabinet. In other embodiments, other types of hinge mechanisms can be used that also do not require holes 115. For example, a separate hinge device can be coupled to a side of the proximal portion of the pole and an upper portion of the cabinet. In an embodiment, a motor can be coupled to the rotational coupling and can be used to raise and lower the elongated pole 105.

In an embodiment, a flange 129 can be mounted to the bottom of the cabinet 103 that provides a mounting bracket for connecting the cabinet 103 and elongated pole 105 to the block 101. The flange 129 can have mounting holes 163 and fasteners can be used to secure the flange 129 and cabinet 103 to the block 101. In different embodiments, the flange(s) 129 can have various different shapes such as round, rectangular, triangular, square etc. The flange 129 may also have an alignment adjustment mechanism so that the pole 105 can be vertically oriented when the block 101 is on a non-level surface.

Figure 3:
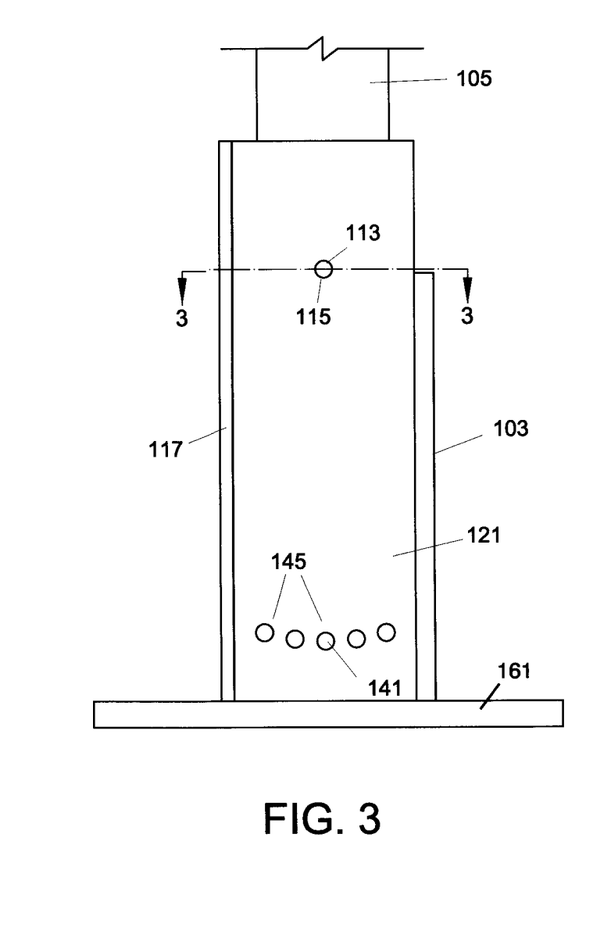
FIG. 3 is a side view of an embodiment of a cabinet.

With reference to FIG. 3, in some embodiments, the cabinet 103 can have an alignment mechanism for the elongated pole 105. It can be desirable for the elongated pole 105 to be in a vertical position when raised in the cabinet 103. The alignment mechanism can provide adjustments to the vertical orientation of the elongated pole 105. In the illustrated embodiment, an upper pin 113 extends through a hole in the lower portion of the elongated pole 105. The upper pin 113 also is mounted to two holes on opposite side walls of the cabinet 103. The upper pin 113 creates a hinge point about which the elongated pole 105 can rotate.

When the elongated pole 105 is raised, a lower pin 141 can be placed through a hole in the lower end of the elongated pole 105 and two of the lower holes 145 in the side walls of the cabinet 103 to lock the elongated pole 105 in the vertical position. In the illustrated embodiment, the lower pin 141 is placed through the center lower hole. However, if the angle of the elongated pole 105 needs to be adjusted, the lower pin 141 can be placed through any of the other lower holes 105 to lock the elongated pole 105 is an angled position.

Figure 4:
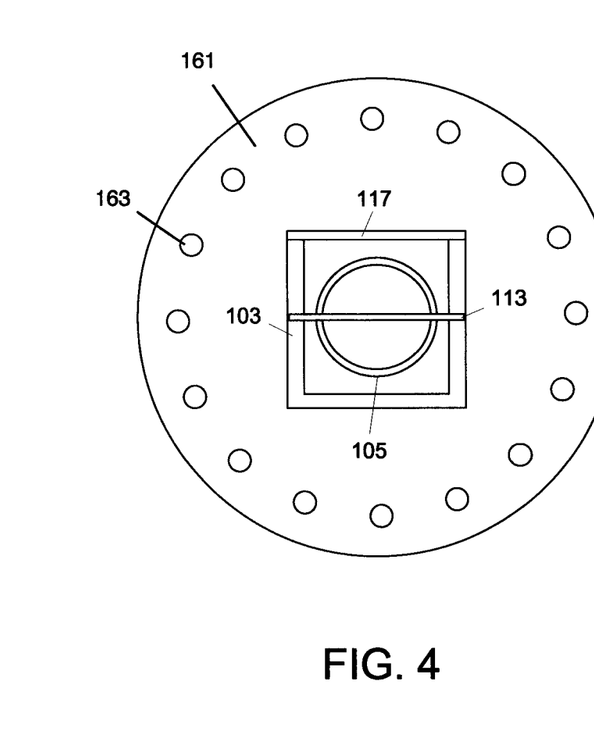
FIG. 4 is a top cross section view of an embodiment of a cabinet.

With reference to FIG. 4, a top view of an embodiment of the cabinet is illustrated on a circular mounting plate or flange 161 with a plurality of holes 163 arranged around the inner perimeter of the flange 161. This configuration allows the cabinet 103 to be rotated so that the rotational position of the cabinet 103 and pole 105 can be adjusted so that the pole 105 can be tiled into the upright vertical position. The ability to change the angle of the elongated pole 105 relative to the cabinet 103 and block 101 can be useful when the block 101 is placed on an angled or uneven surface.

Figure 5:
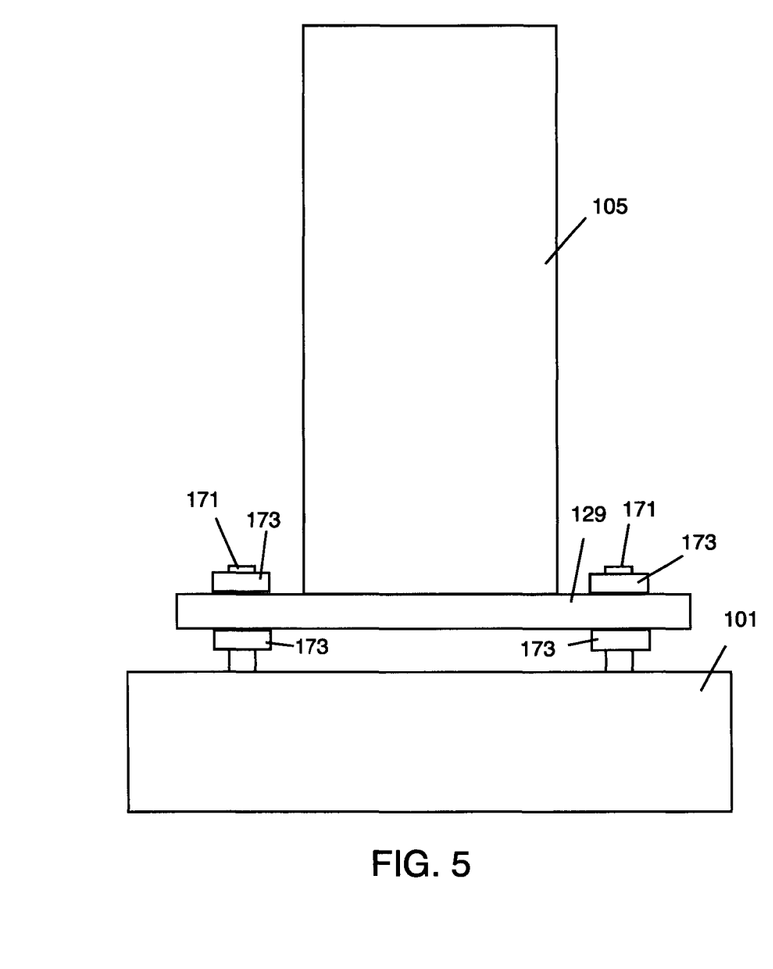
FIGS. 5 and 6 are side views of an embodiment of an elongated pole mounted to a block with alignment shims.

In an embodiment illustrated in FIG. 5 threaded bolts 171 can extend upward from block 101 and the position of the flange 129 on the bolts 171 can be adjustable. In an embodiment, lower nuts 173 can be adjusted to the desired height so that the flange 129 placed on the nuts 173 is aligned in a horizontal plane so the pole 105 will be vertical.

An upper nut 173 can be placed on the bolt 171 over the flange 129 and tightened to secure the flange 129 in a horizontal plane or any desired angular orientation.

Figure 6:
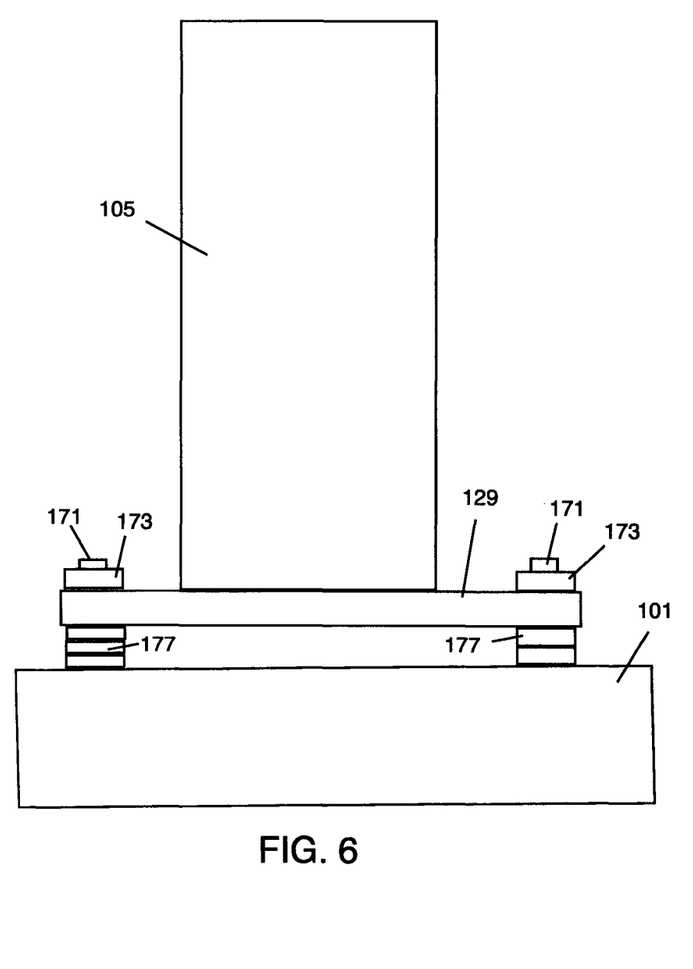

In an embodiment illustrated in FIG. 6 threaded bolts 171 can extend upward from block 101 and the position of the flange on the bolts 171 can be adjustable. In the illustrated embodiment, shims 177 can be stacked on the bolts 171 so the upper surface of the uppermost shim 177 can be adjusted to the desired height so that the flange placed on the nuts is aligned in a horizontal plane so the pole will be vertical. An upper nut 173 can be placed on the bolt 171 over the flange 129 and tightened to secure the flange 129 in a horizontal plane or any desired angular orientation.

Figure 7:
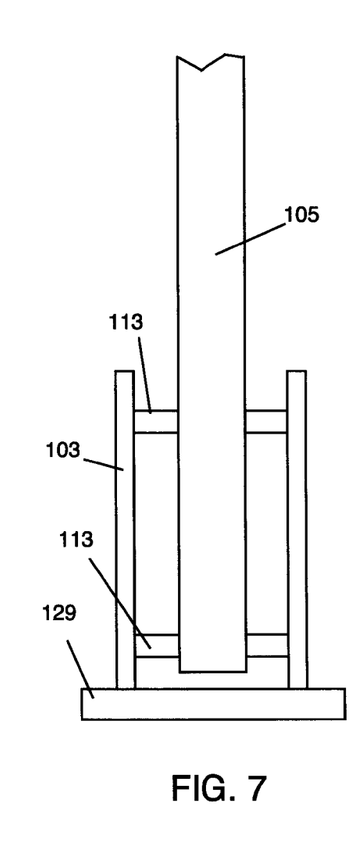
FIGS. 7 and 8 illustrate front views of an embodiment of the cabinet enclosure and lower portion of the elongated pole.

In an embodiment illustrated in FIG. 7 the lower portion of the elongated pole 105 extends through the cabinet 103 with upper pin 113 placed near the top of the cabinet and lower pin 113 placed near the bottom of the cabinet 103. The elongated pole 105 is suspended using the pins 113 above the cabinet flange 129 with enough clearance for the elongated pole to rotate from a vertical position to a horizontal position.

Figure 8:
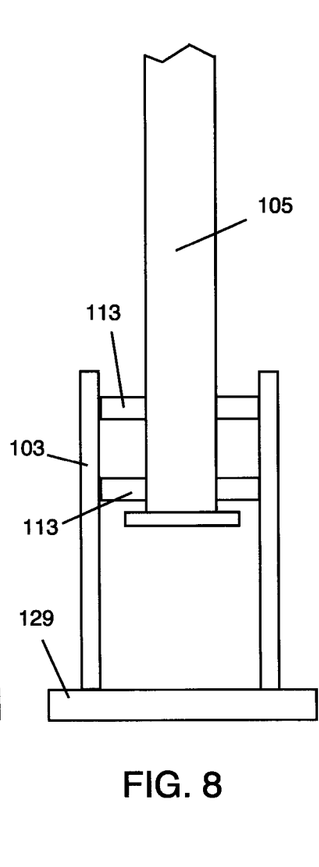

In an embodiment illustrated in FIG. 8 the lower portion of the elongated pole 105 is suspended within the upper half of the cabinet 103 with upper and lower pins 113 placed near the top of the cabinet 103. This embodiment allows for additional space within the cabinet 103.

Figure 9:
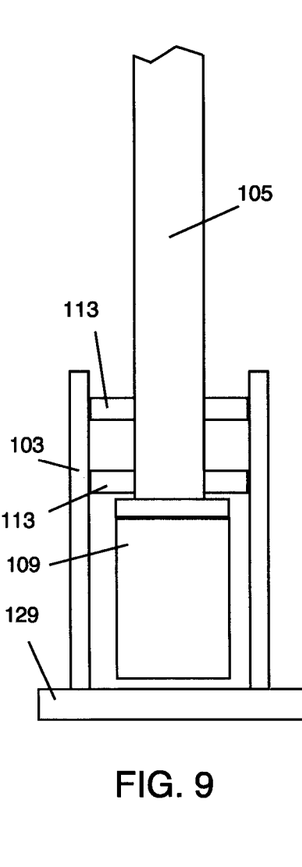
FIG. 9 illustrates a front view of an embodiment of the cabinet enclosure and lower portion of the elongated pole with a cabinet enclosure mounted to the elongated pole.

In an embodiment illustrated in FIG. 9, the cabinet enclosure 109 is coupled to a proximal end of the elongated pole 105. The lower portion of the elongated pole 105 is suspended within the upper half of the cabinet 103 with upper and lower pins 113 placed near the top of the cabinet 103.

Figure 10:
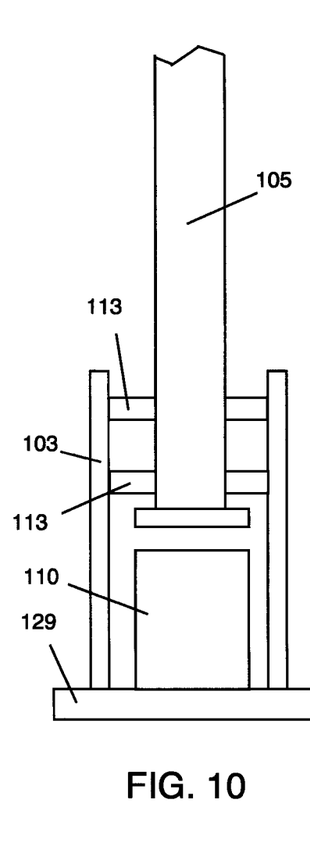
FIG. 10 illustrates a front view of an embodiment of the cabinet enclosure and lower portion of the elongated pole with a cabinet enclosure mounted to the cabinet.

FIG. 10 illustrates an embodiment similar to FIG. 8 which the lower portion of the elongated pole 105 is suspended within the upper half of the cabinet 103 with upper and lower pins 113 placed near the top of the cabinet 103 and a cabinet enclosure 110 is mounted to the inner lower surface of the cabinet 103 but is not in direct physical contact with the elongated pole 105.

Enclosures can be structures having interior volumes that can be used to provide protection for IOT components. The enclosures can have various shapes such as cylindrical, box, etc. The enclosures can have a uniform cross section so that the IOT components can be easily slid into the enclosures. The enclosure can include wiring, electrical components, a printed circuit board (PCB), a power supply, filter, electrical components, and connectors from components in the enclosure to components in the block 101. The enclosures can also have access ports such as doors and covers. As illustrated in FIG. 1, the system can include a cabinet enclosure 109, a block enclosure 111, and a sliding enclosure 107 which are described in more detail below.

Cabinet Enclosure

With reference to FIG. 1, the cabinet enclosure 109 may be a hollow structure that has sidewalls and a removable lid. The cabinet enclosure 109 is attached to the end of the elongated pole 105, and is normally positioned inside the cabinet 103. In an embodiment, the cabinet enclosure 109 can include a connecting mechanism for securing the cabinet enclosure 109 to the elongated pole 105. In other embodiments, the cabinet enclosure 109 may be located anywhere within the cabinet 103 depending on how the elongated pole 105 is hinged in combination with the tilt mounts. In the illustrated example, the cabinet 103 can include a hole 115 for the pin 113 and have conduit channels in the base that can extend to the cabinet enclosure 109 that allow electrical connections into the cabinet enclosure 109. In some embodiments, the block 101 can have one or more block enclosures 111 that have conduit channels connected to the cabinet enclosure 109 that allow electrical signals to be transmitted between the cabinet enclosure 109, the block enclosure(s) 111, and up into the pole 105 and the IOT sensor 123 camera. The cabinet enclosure 109 can rotate with the elongated pole 105 to a horizontal position and a more vertical position. The cabinet enclosure 109 can be housed inside the cabinet 103 to allow for its contents to be protected from vandalism, rodents, and adverse weather.

Block Enclosure

With reference to FIG. 1, in the illustrated embodiment, the block enclosure 111 is a three-dimensional rectangular structure having a length, a width, and a height. While the block enclosure 111 is illustrated as a three-dimensional rectangular structure, in other embodiments, the block enclosure 111 can be any other three-dimensional geometric shape that has a hollow interior or one or more enclosures within it. The block enclosure 111 should be constructed of a waterproof material so that within its internal volume, the block enclosure 111 can house components such as batteries 183, printed circuit boards, wiring, transceivers 191, and other electrical components (shown in FIG. 17). The block enclosure 111 is contained within the block 101. In other embodiments, there can be multiple block enclosures 111 contained within the block 101.

The block enclosure 111 can also include a tubular conduit that extends from the block enclosure 111 to the upper surface of the block 101. Cables and/or wiring can run through the tubular conduit so that the electrical components in the block enclosure 111 can be electrically coupled to other electrical components in the cabinet 103, the elongated pole 105, the cabinet enclosure 109, and the sliding enclosure 107.

The block enclosure 111 is accessible through the block enclosure cover 119, which is held in place with fasteners such as bolts or other locking mechanisms to prevent unauthorized access to the block enclosure 111. The block enclosure 111 is also beneficial in that servicing of IoT devices within the block enclosure 111, is made more accessible since the servicer does not need to climb or use a lift to access device components at the top of the elongated pole 105 or dig into the ground to access the block enclosure 111.

Sliding Enclosure

Figure 11:
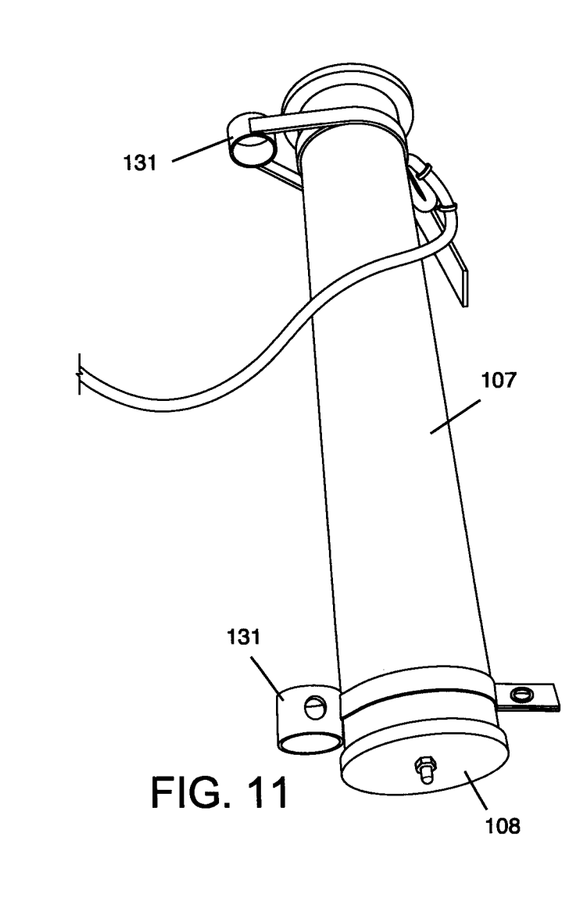
FIG. 11 is a side perspective view of an embodiment of a sliding enclosure.

With reference to FIGS. 1 and 11, the sliding pole enclosure 107 is a hollow elongated cylinder with fasteners 131 on both sides allowing it to attach or be mounted to any portion of the elongated pole 105. The sliding enclosure 107 moves with the elongated pole 105 when tilted in either direction to enable access to its internal components through access doors or hatches.

The internal components of the sliding pole enclosure 107 can include wiring, fiber, and other connectivity materials that need to run the length of the elongated pole 105 to enable functionality of the IOT devices. The internal components of the sliding pole enclosure 107 may also include other serviceable radio communication and electronics equipment enabling the deployment and installation of cameras, antennas, and other IOT devices.

The sliding pole enclosure 107 can move alongside the elongated pole 105 to allow for convenient human access at any point along the length of the elongated pole 105. The sliding pole enclosure 107 can be moved and secured in place by the fasteners 131 at a location most convenient to a service technician to access and interact with the internal serviceable components. The sliding pole enclosure 107 can also extend into the cabinet 103, provided that the cabinet door 117 provided the top of the cabinet is large enough in another embodiment. The fasteners 131 can be made of various plastic, metal, rubber or other waterproof materials. The sliding pole enclosure 107 is made of weather-proof materials like rubber, plastic, metal, etc. The sliding pole enclosure 107 materials also prevent rodent or other animal intrusions and human vandalism to the internal components. A sliding enclosure cover 108 which can be an access door or hatches can be secured with a locking mechanism to prevent unauthorized access to the sliding pole enclosure 107.

Figure 16:
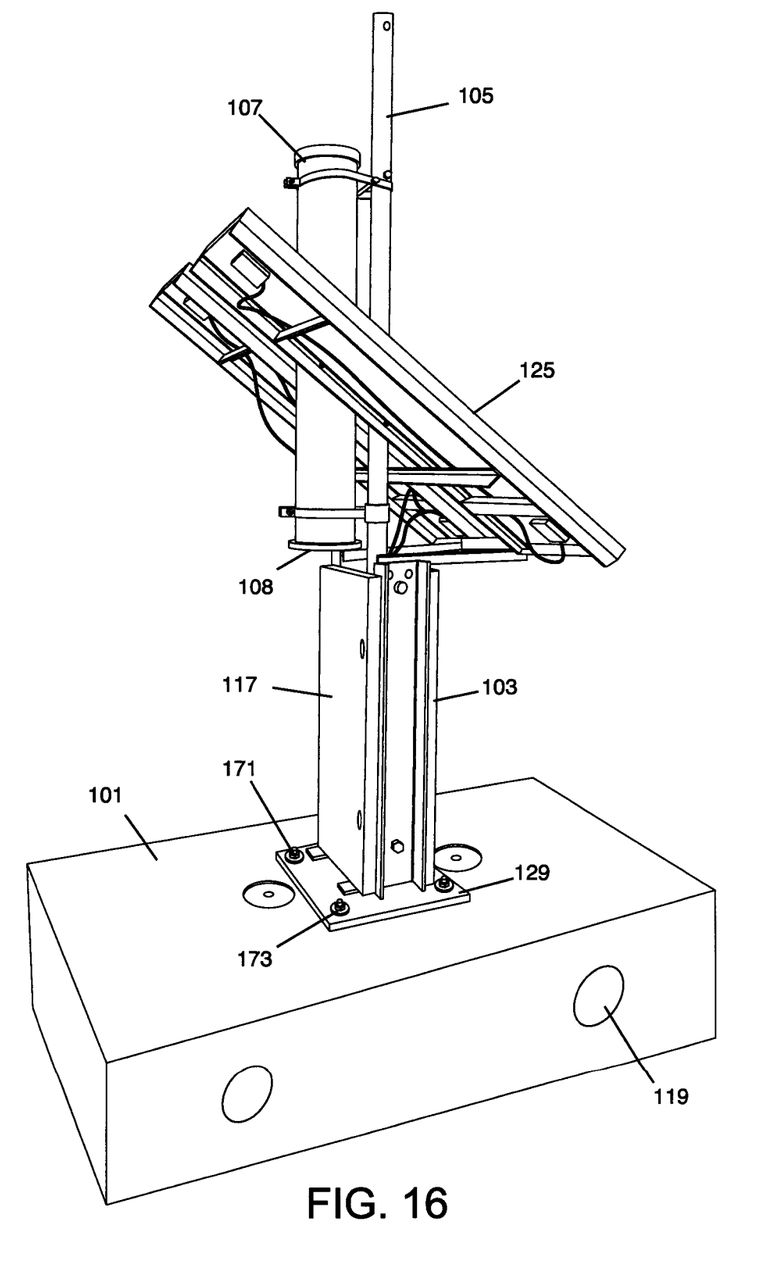
FIG. 16 is a top side perspective view of an embodiment of a ground accessible IOT apparatus with the pole in the raised position.

FIG. 16 also provides a side view of the device where solar panels 125 surround both the elongated pole 105 and the sliding pole enclosure 107. In this iteration, the sliding pole enclosure 107 will house wiring and other equipment related to the solar panels 125 like a breaker box or batteries 183.

Elongated Pole

The elongated pole 105 can be 10-20 feet long and have a hollow interior. The elongated pole 105 can be made of materials such as lightweight aluminum, plastic, fiberglass, carbon fiber, steel, etc. The cross-section shape of the elongated poles 105 can be cylindrical, rectangular, triangular, pentagon, etc. The elongated pole 105 can contain wiring between the cabinet enclosure 109, block 101 and IOT device. The elongated pole 105 can provide weather proof protection for the wiring in the elongated pole 105 and other components within the elongated pole 105.

With reference to FIG. 1, a camera 123 can be mounted to the top of the elongated pole 105. For example, an IOT device can be coupled to an adjustable bracket 127 that is attached to the elongated pole 105 that is supported by the block 101 and cabinet 103 assembly. The block 101 functions as a stabilizing support for the elongated pole 105 to avoid it falling. The cabinet 103 functions to provide a point of rotation for the elongated pole 105 and protection for the components and wiring in the sliding enclosure 107 at the bottom of the elongated pole 105 and the wiring extending from the elongated pole 105 and cabinet 103 to the block 101.

Figure 13:
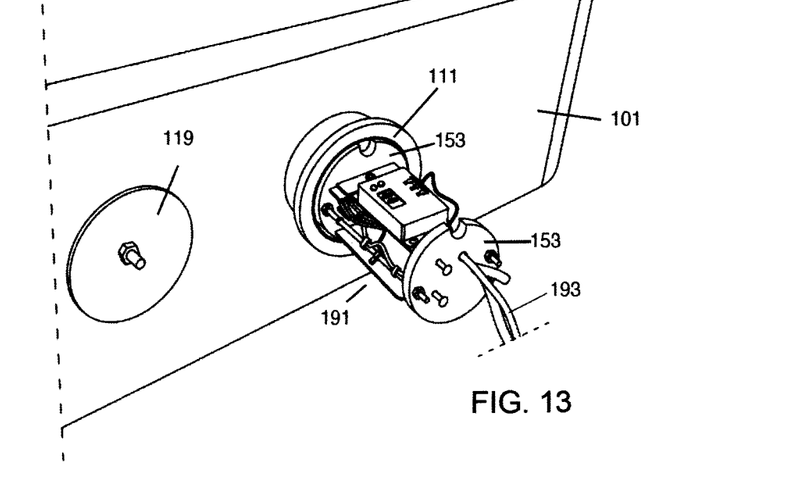
FIG. 13 is a side view of an embodiment the block with the IOT apparatus partially removed from the block enclosure.

FIG. 13 illustrates a perspective side view of an embodiment the block 101 with the IOT apparatus 191 partially removed from the block enclosure 111. The IOT apparatus 191 can have a support frame 153 that includes a conduit track that supports the IOT apparatus 191 and allows the IOT apparatus 191 to be easily slid into and out of the cylindrical block enclosure 111. An example of a conduit track is described and illustrated in U.S. Pat. No. 10,851, 936, "Camera Mount Plate And Module Access Slide For Poles Used For Roadside Electronic Systems" which is incorporated by reference in its entirety. In this example the block enclosure 111 is cylindrical but in various embodiments the enclosure may be other shapes. Electrical wiring 193 can extend from the IOT apparatus 191 to connect the IOT apparatus 191 to power and other IOT components. In some embodiments, the electrical wiring 193 can extend outward from the block 101. In other embodiments, the electrical wiring 193 can be placed in a conduit track that is placed in the grooves formed in the frame 153 and run through the conduit 114 extending upward from the block 101 shown in FIGS. 1 and 12.

Figure 14:
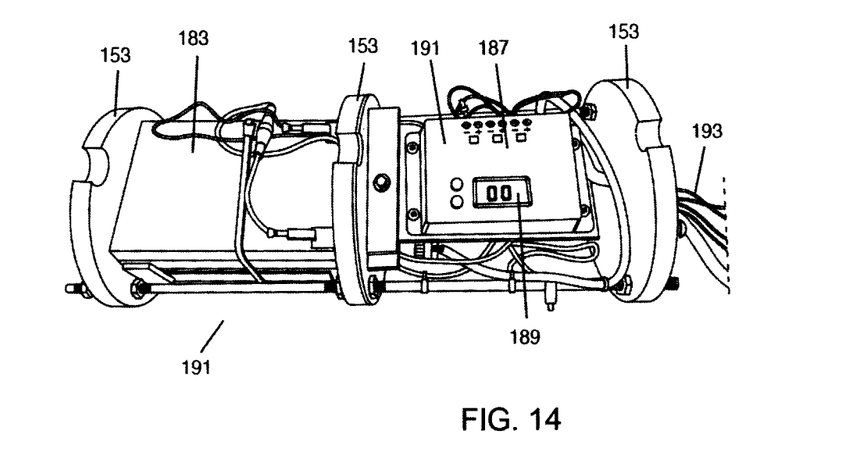
FIG. 14 is a top view of an embodiment the IOT apparatus.

FIG. 14 illustrates a perspective top view of an embodiment of the IOT apparatus 151 which can include a battery 183, a processor 187, an output device 189 and a transmitter or transceiver 191. The IOT apparatus 151 can also include electrical wiring 193 that can be used for communications with other IOT apparatus 151 components such as the IOT sensor and/or an external power source (not shown).

Figure 15:
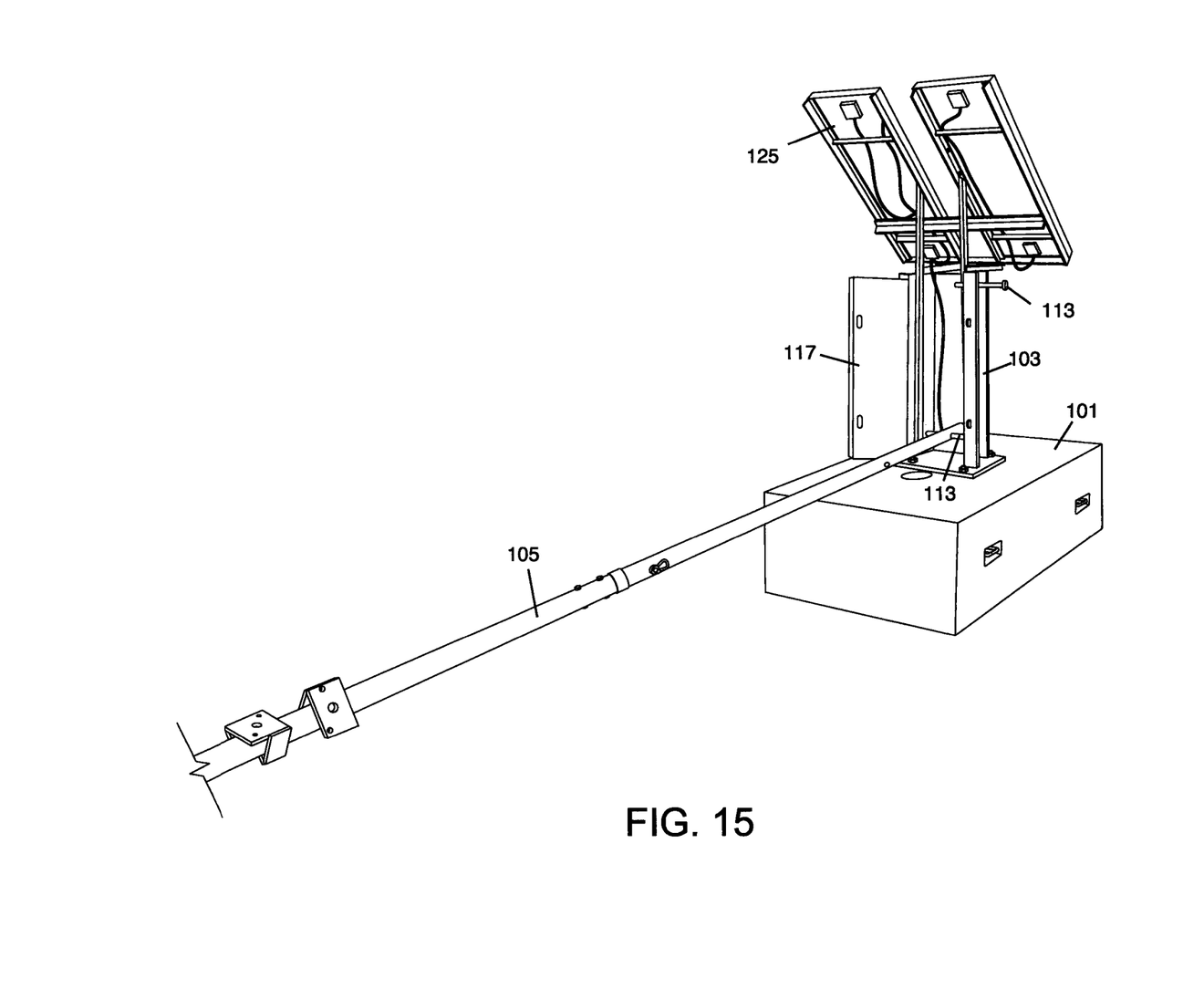
FIG. 15 illustrates a rear view of an embodiment of the open cabinet with the elongated pole in a lowered position.

With reference to FIG. 15, the block 101 and cabinet 103 assembly is shown with the elongated pole 105 in a horizontal position with the hinged cabinet door 117 to the cabinet 103 open. In FIG. 16 the block 101 and cabinet 103 assembly is shown with the elongated pole 105 in a vertical position with the hinged cabinet door 117 to the cabinet 103 closed. While the block 101, cabinet 103 and elongated pole 105 assembly has been illustrated in specific embodiments, any combination of these components can be assembled in other embodiments. A key aspect of this invention is the solar panels 125 are not on the elongated pole 105 but are supported by the cabinet 103 allowing the elongated pole 105 to be positioned between the solar panels 125. This configuration allows a proximal portion of the tilting elongated pole 105 to fit within the space inside the cabinet 103. This configuration also allows the solar panels attached to the cabinet with the rotating base to be oriented for sunlight direction. The cabinet 103 can also have additional enclosure space to allow the slide enclosure 107 to slide down the elongated pole 105 between the solar panels 125 and extend end wise into the cabinet 103 either partially or fully to secure wiring access to the cabinet 103 and block 101. This design offers the option of solar panels 125 without a top-heavy design so a tilting elongated pole 105 can be deployed while still offering expansion space for additional enclosures. This design offers functionality and flexibility not found in the prior art. In this illustrative example two solar panels 125 are used, but in other embodiments no panels, one solar panel, or more than two solar panels may be stacked and mounted on the cabinet 103 with the elongated pole 105 in between. This allows for additional solar panels to be added without modifying or disrupting, or top loading the elongated pole 105 and allowing the elongated pole 105 to remain dedicated to IOT equipment and sensors.

The present invention is directed towards a system for supporting IOT Devices. In different embodiments, various different IOT devices can be used. For example, in an embodiment the IOT device can have a sensor such as a camera which can be a visual or infrared camera that can be mounted to the top of the elongated pole. In other embodiments, the sensor can detect air quality or pollution, wind speed, humidity, temperature, sound levels, etc. The IOT device can also have an output device such as a speaker or intercom which can be used for providing audio warnings such as for potential hazards. In other embodiments, the IOT output can have a light fixture that can respond to motion sensor detections which can result in the system turning on the light. In another embodiment, the IOT device can include a speed sensor such a radar or lidar which can result in the output displaying warnings of road hazards or displays the speed of vehicles.

Figure 17:
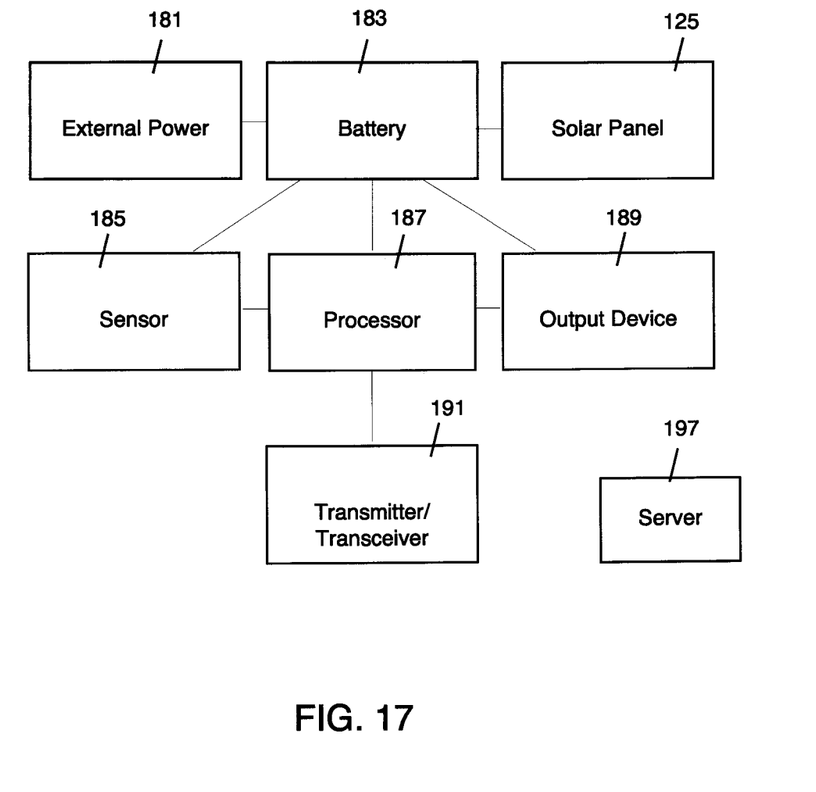
FIG. 17 is a block diagram of the IOT components.

FIG. 17 illustrates a block diagram of an embodiment of the IOT device components which can be mounted in the described enclosures and/or on the top of the elongated pole. The IOT device components can include any combination of: a processor 187 that is powered by a battery 183, an external power source 181, and/or solar panels 125. The processor 187 processes signals from one or more sensors 185 such as a camera, microphone, air sensor, etc. The processor 187 can then output an output signal to an output device 189 which can be: a visual display, a light, a speaker, etc. The processor 187 can also be coupled to a transmitter or a transceiver which can receive radio frequency control signals such as requests for status and sensor data from a server computer 197. The processor 187 then transmit radio frequency signals returning the requested data. In some embodiments, the transmitter/transceiver can provide cellular communications with the internet so that the JOT device can communicate with a server computer 197. In some embodiments, a server computer 197 can control and communicate with many JOT devices.

In different embodiments, the system components can be used various combinations. Table 1 below includes a partial listing of possible system component combinations.

TABLE 1

| 1 | Block | No cabinet base | Straight Pole | Enclosure within Block | No Solar Panels External Power |
| 2 | Block | Cabinet Base | Tilting Pole | Enclosure On end of pole within Cabinet | External Power |
| 3 | Block | Cabinet Base | Tilting Pole | Enclosure Stand Alone within Cabinet | External Power |
| 4 | Block | Cabinet Base | Tilting Pole | Enclosure within Block | External Power |
| 5 | Block | Cabinet Base | Tilting Pole | Enclosure within Block and Stand Alone in Cabinet | External Power |
| 6 | Block | Cabinet Base | Tilting Pole | Enclosure within Block and On End of Pole | External Power |
| 7 | Block | Cabinet Base | Tilting Pole | Enclosure within Block | Solar on Cabinet Base |
| 8 | Block | Cabinet Base | Tilting Pole from bottom | Enclosure within Block | Solar atop Pole |
| 9 | Block | Cabinet Base | Tilting Pole | External Stand Alone in Cabinet | Solar on Cabinet Base |
| 10 | Block | No Cabinet Base | Straight Pole | External Enclosure On Pole Ringed | External Power |
| 11 | Block | No Cabinet Base | Straight Pole | Enclosure within Block and External Enclosure On Pole Ringed | External Power |
| 12 | Block | Cabinet Base | Tilting Pole | Enclosure within Block and External Enclosure On Pole Ringed | Solar on Cabinet Base |

All references cited herein are intended to be incorporated by reference. Although the present invention has been described above in terms of specific embodiments, it is anticipated that alterations and modifications to this invention will no doubt become apparent to those skilled in the art and may be practiced within the scope and equivalents of the appended claims. More than one computer may be used, such as by using multiple computers in a parallel or load-sharing arrangement or distributing tasks across multiple computers such that, as a whole, they perform the functions of the components identified herein; i.e. they take the place of a single computer. Various functions described above may be performed by a single process or groups of processes, on a single computer or distributed over several computers. Processes may invoke other processes to handle certain tasks. A single storage device may be used, or several may be used to take the place of a single storage device. The present embodiments are to be considered as illustrative and not restrictive, and the invention is not to be limited to the details given herein. It is therefore intended that the disclosure and following claims be interpreted as covering all such alterations and modifications as fall within the true spirit and scope of the invention.

What is claimed is:

1. An internet of things device support apparatus comprising:
   a block for maintaining a fixed placement on a ground surface wherein said block is not submerged underground;
   a cabinet having side walls, a hinged door, and a base rigidly coupled to said block;
   a block enclosure for housing internet of things device electronics including: a battery and a transmitter wherein said block enclosure is within said block; and
   an elongated pole having a proximal portion and a distal portion, wherein said elongated pole is rotationally coupled to said cabinet at said proximal portion of said elongated pole and said proximal portion of said elongated pole is within said cabinet when said elongated pole is in a vertical position.

2. The internet of things device support apparatus of claim 1 wherein said block is made of concrete, or metal, and said block enclosure is a water-proof structure embedded within said block and said water-proof block enclosure is externally accessible through a cover and said water-proof enclosure is connected to a conduit that extends into said cabinet.

3. The internet of things device support apparatus of claim 1 further comprising:
   a sliding enclosure for housing additional internet of things device electronics, said sliding enclosure coupled to said elongated pole, or a cabinet enclosure for housing additional internet of things device electronics, said cabinet enclosure coupled to a proximal end of said elongated pole.

4. The internet of things device support apparatus of claim 1 wherein said internet of things device electronics are mounted to said distal portion and said proximal portion of said elongated pole is affixed to a hinge of said cabinet wherein said hinge comprises a tilt mount pin placed through cabinet holes in said cabinet and a pole hole in said proximal portion of said elongated structure for tilting said elongated structure from said vertical position for normal operation to a horizontal position for service the distal end of said elongated pole.

5. The internet of things device support apparatus of claim 4 wherein a sliding enclosure is mount to said elongated pole, and said sliding enclosure is movable along a length of said elongated pole with adjustable couplings, said adjustable couplings are tightened to secure said sliding enclosure at any position along said length of said elongated pole.

6. The internet of things device support apparatus of claim 5 further comprising:
   a first solar panel mounted to a first side of said cabinet; and
   a second solar panel mounted to a second side of said cabinet opposite said first side of said cabinet;
   wherein said elongated pole is between said first solar panel and said second solar panel.

7. The internet of things device support apparatus of claim 6 wherein said cabinet has sufficient interior space to allow said sliding enclosure to slide down to said proximal portion of said pole between said first solar panel and said second solar panel so that said sliding enclosure is either partially or fully within said cabinet and said block.

8. The internet of things device support apparatus of claim 1 further comprising:
   a first plurality of stacked solar panels mounted to a first side of said cabinet; and
   a second plurality of stacked solar panels mounted to a second side of said cabinet opposite said first side of said cabinet.

9. An apparatus for supporting an internet of things device, comprising:
   an elongated pole having a distal portion and a proximal portion;
   a sensor coupled to said distal portion of said elongated pole;
   an enclosure coupled to said elongated pole for storing internet of things device electronics including radio communication equipment for operating said sensor;
   a block that rests on a ground surface; and
   a cabinet having a cabinet flange, side walls, and a hinged door coupled to said at least one of said side walls, said cabinet flange mounted on a top surface of said block wherein said elongated pole is rotationally coupled to said cabinet at said proximal portion of said elongated pole and said proximal portion of said elongated pole is within said cabinet when said elongated pole is in a raised vertical position.

10. The apparatus of claim 9, wherein said elongated pole is movable between said raised vertical position and a lowered horizontal position, said proximal portion of said elongated pole is accessible through said hinged door when said elongated pole is in said raised vertical position.

11. The apparatus of claim 9, wherein said enclosure is attachable to said proximal portion or said distal portion of said elongated pole.

12. The apparatus of claim 9, further comprising:
   a block enclosure for housing additional said internet of things device electronics, said block enclosure within said block.

13. The apparatus of claim 9, wherein said enclosure houses a source of electrical power.

14. The apparatus of claim 9, wherein said block is made of at least one of the following weather-resistant materials: poured concrete, metal, or steel.

15. The apparatus of claim 9, wherein said block includes access covers.

16. An internet of things device support apparatus comprising:
   a cabinet having parallel side walls with mounting holes extending through said parallel side walls at a base of said parallel side walls and a hinged door;
   a cabinet enclosure coupled to a proximal portion of an elongated pole, said cabinet enclosure is adapted to contain internet of things device electronics; and
   a pair of mount pins removably secured to said parallel side walls, wherein one of said pair of mount pins is above the other of said pair of mount pins;
   wherein said proximal portion of said an elongated pole is coupled to said pair of mounting pins and said elongated pole is rotationally coupled to said cabinet at said proximal portion of said elongated pole and said proximal portion of said elongated pole is within said cabinet when said elongated pole is in a vertical position.

17. The internet of things device support apparatus of claim 16,
   further comprising:
   a block enclosure for housing additional internet of things device electronics, said block enclosure within said block, or a sliding enclosure for housing said additional internet of things device electronics, said sliding enclosure coupled to a side portion of said elongated pole.

18. The internet of things device support apparatus of claim 16, wherein said parallel side walls are made of a weather-resistant material including steel, metal, or a composite material.

\* \* \* \* \*